United States Patent
Sauerbrey et al.

(10) Patent No.: US 7,203,859 B2
(45) Date of Patent: Apr. 10, 2007

(54) VARIABLE CLOCK CONFIGURATION FOR SWITCHED OP-AMP CIRCUITS

(75) Inventors: Jens Sauerbrey, Taufkirchen (DE); Martin Wittig, Delmenhorst (DE); Roland Thewes, Gröbenzell (DE)

(73) Assignee: Infineon Technologies AG, München (DE)

( * ) Notice: Subject to any disclaimer, the term of this patent is extended or adjusted under 35 U.S.C. 154(b) by 713 days.

(21) Appl. No.: 09/932,891

(22) Filed: Aug. 20, 2001

(65) Prior Publication Data

US 2002/0041204 A1    Apr. 11, 2002

(30) Foreign Application Priority Data

Aug. 18, 2000 (DE) ................. 100 40 422

(51) Int. Cl.
*G06F 1/04* (2006.01)
(52) U.S. Cl. ..................... 713/500; 713/501
(58) Field of Classification Search ............... 713/500, 713/501
See application file for complete search history.

(56) References Cited

U.S. PATENT DOCUMENTS

| | | | | |
|---|---|---|---|---|
| 4,551,638 A | * | 11/1985 | Varadarajan | 326/126 |
| 4,951,303 A | * | 8/1990 | Larson | 377/110 |
| 5,097,208 A | * | 3/1992 | Chiang | 324/537 |
| 5,534,863 A | * | 7/1996 | Everitt et al. | 341/150 |
| 5,598,326 A | * | 1/1997 | Liu et al. | 363/34 |
| 5,723,998 A | * | 3/1998 | Saito et al. | 327/513 |
| 5,745,002 A | * | 4/1998 | Baschirotto et al. | 327/554 |
| 5,796,360 A | | 8/1998 | Wendelrup | |
| 5,818,276 A | | 10/1998 | Garrity et al. | |
| 5,880,619 A | | 3/1999 | Barrett, Jr. et al. | |
| 5,994,960 A | | 11/1999 | Baschirotto et al. | |
| 6,037,836 A | * | 3/2000 | Yoshizawa | 330/9 |
| 6,081,218 A | | 6/2000 | Ju et al. | |
| 6,232,845 B1 | * | 5/2001 | Kingsley et al. | 331/57 |
| 6,310,953 B1 | * | 10/2001 | Yoshida et al. | 379/399.01 |
| 6,344,767 B1 | * | 2/2002 | Cheung et al. | 327/336 |
| 6,392,466 B1 | * | 5/2002 | Fletcher | 327/392 |

(Continued)

FOREIGN PATENT DOCUMENTS

EP    0 689 268 A1    12/1995

(Continued)

OTHER PUBLICATIONS

A. Baschirotto et al.: "A 1V CMOS fully differential switched-opamp bandpass Σ Δ modulator", Solid State Circ. Conf. 1997 (ESSCIRC 97), pp. 152-155.

(Continued)

*Primary Examiner*—Rehana Perveen
*Assistant Examiner*—Tse Chen
(74) *Attorney, Agent, or Firm*—Laurence A Greenberg; Werner H. Stemer; Ralph E. Locher

(57) ABSTRACT

A clock configuration for driving switched op-amp circuits operated in opposite phases is presented in which a common off-phase of variable length is inserted between the on-phases of the individual operational amplifiers. The length of the off-phase can be adapted to the transient response of the operational amplifiers used. The clock configuration according to the invention can be used for further reducing the power consumption of switched op-amp circuits.

30 Claims, 4 Drawing Sheets

U.S. PATENT DOCUMENTS

| | | | |
|---|---|---|---|
| 6,477,115 B1 * | 11/2002 | Inoshita et al. | 368/120 |
| 6,617,908 B1 * | 9/2003 | Thomsen et al. | 327/337 |
| 6,646,396 B2 * | 11/2003 | Brown et al. | 318/268 |
| 6,653,967 B2 * | 11/2003 | Hamashita | 341/172 |

FOREIGN PATENT DOCUMENTS

| | | |
|---|---|---|
| EP | 0 836 275 A1 | 4/1998 |
| JP | 60-74815 | 4/1985 |
| WO | WO 96/25795 | 8/1996 |

OTHER PUBLICATIONS

M. Steyaert et al.: "Switched-Opamp, a Technique for Realising full CMOS Switched-Capacitor Filters at Very Low Voltages", Solid State Circ. Conf. 1993 (ESSCIRC 93), pp. 178-181.

* cited by examiner

VARIABLE CLOCK CONFIGURATION FOR SWITCHED OP-AMP CIRCUITS

BACKGROUND OF THE INVENTION

Field of the Invention

The invention relates to a circuit configuration in switched op-amp technology and to a method for clocking successive operational amplifier stages constructed in switched op-amp technology.

The switched op-amp technology has developed from the switched capacitor technology to be able to take into account the requirement for ever-lower supply voltages. The switched op-amp technology is used in the construction of filters and converters and is especially suitable for fields of application in which low power consumption is of importance. The field includes, for example, applications in the mobile radio field in which the load on the battery must be kept as low as possible.

Whereas the capacitors are switched on and off by clocked switches in the switched capacitor technology, the operational amplifiers are also switched on and off by a switching clock signal in the switched op-amp technology. Such a configuration results in considerable power saving.

In the prior art, two successive operational amplifier stages are operated with opposite clock pulses. A prior art non-overlapping two-phase clock is used for the clocking. Accordingly, the operational amplifiers of the successive stages are never active at the same time. However, the clock configuration is selected such that each operational amplifier is switched on for approximately 50%.

SUMMARY OF THE INVENTION

It is accordingly an object of the invention to provide a variable clock configuration for switched op-amp circuits and a method for clocking successive operational amplifier stages constructed in switched op-amp technology, that overcomes the hereinafore-mentioned disadvantages of the heretofore-known devices and methods of this general type and that achieves a further reduction in the power consumption of switched op-amp circuits.

With the foregoing and other objects in view, there is provided, in accordance with the invention, a circuit configuration in switched op-amp technology including at least one switchable operational amplifier having an input and an output, at least one sampling capacitor connected to the input, at least one integrating capacitor connected to the input and to the output, a clock generator producing at least two non-overlapping switching-clock signals each having switching-clock phases including an on-phase and an off-phase; and a phase-variance device varying the switching-clock phases in which the first and second switching-clock signals are in the off-phase. The phase-variance device is connected to the clock generator. The at least two non-overlapping switching-clock signals include a first switching-clock signal and a second switching-clock signal. The clock generator controls charging of the sampling capacitor with the first switching-clock signal and switching the operational amplifier on and off with the second switching-clock signal.

The circuit configuration in switched op-amp technology according to the invention includes at least one switchable operational amplifier, at least one sampling capacitor that can be connected to the input of the operational amplifier, and at least one integration capacitor disposed between the input and the output of the operational amplifier.

At least two non-overlapping switching-clock signals are generated for controlling the circuit configuration. As long as one of the two switching-clock signals is at 1, the sampling capacitor is charged up by the input signal. During the phase, the other one of the two switching-clock signals is at 0 and the operational amplifier is in its switched-off state. At the end of the sampling phase, all switching-clock signals are in a common off-phase. The other one of the two switching-clock signals then changes to 1 and, thus, switches on the operational amplifier. During the integration-phase that now starts, the operational amplifier, as the active component, transfers the charge of the sampling capacitor connected to its input to the integration capacitor. At the end of the integration-phase, both switching-clock signals are again at 0.

The circuit configuration according to the invention has a device or means for varying the switching-clock phases in which all switching-clock signals are in the off-phase. The configuration makes it possible to stretch the switching-clock phases in which both switching-clock signals are at 0, at the cost of the on-phases. It is only necessary to ensure that the sampling capacitor can be completely charged up by the input signal during the on-phase of one switching-clock signal and that the operational amplifier can settle sufficiently for the charge to be transferred to the integration capacitor during the on-phase of the other switching-clock signal.

Thus, the common off-phase of the two switching-clock signals can be extended up to the limit predetermined by the transient response, making it possible to use the potential for power saving to its full extent. The invention is, thus, particularly suitable for use in mobile transceivers (mobiles), mobile Internet devices (WAP technology) but also for medical use (hearing aids, pacemakers etc.) in which a long life of the batteries used is of importance.

In particular, the invention makes it possible to adapt the length of the on- and off-phases individually to the Q factor of the operational amplifiers used. To take into consideration the influence of process spreads in the manufacture, analog circuits must be dimensioned such that they still meet the required specification even with disadvantageous process effects. In many cases, therefore, the behavior of an analog circuit is better than specified by the manufacturer. If the transient response of the operational amplifier used is better than specified, the potential can be exploited for saving power using the invention.

In accordance with another feature of the invention, it is an advantage if each of the switching-clock phases in which all switching-clock signals are in the off-phase is variable. Both the common off-phase that follows the on-phase of the first switching-clock signal and the common off-phase that follows the on-phase of the second switching-clock signal are extended. The process results in a uniform switching configuration. However, it is also possible to make the off-phase following the on-phase of the first switching-clock signal and the off-phase following the on-phase of the second switching-clock signal be different lengths.

As an alternative, in accordance with another feature of the invention, it is possible to vary only every second one of the switching-clock phases in which all switching-clock signals are in the off-phase. In such a solution, in each case only the off-phase following the on-phase of the first switching-clock signal is extended or in each case only the off-phase following the on-phase of the second switching-clock signal is extended. Thus, every second common off-phase is in each case extended.

It is an advantage, in accordance with an added feature of the invention, if the duration of the switching-clock phases in which all switching-clock signals are in the off-phase can be varied in dependence on the transient response of the operational amplifier. To achieve maximum power saving, the on-phase must be selected to be just long enough for the operational amplifier to be able to settle. Once the transient has ended, the operational amplifier can be switched off.

In accordance with an additional feature of the invention, the duration of the switching-clock phases in which all switching-clock signals are in the off-phase can be varied in dependence on the switching speed of the transistors. Because an operational amplifier is made of individual transistors, the transient response of the operational amplifier is essentially determined by the switching speed of the transistors. Thus, the transistor switching speed is an easily detectable measure of the transient response of the operational amplifier. The switching speed of the transistors can be used directly for determining the duration of the common off-phases: The faster the switching of the transistors, the longer the common off-phase can be selected to be and the greater the power savings.

It is an advantage, in accordance with yet another feature of the invention, if the circuit configuration includes a device or means for detecting the transistor switching speed connected to the operational amplifier. With such a device, the transistor switching speed can be detected individually on the substrate so that the length of the common off-phases can be matched to the Q factor of the operational amplifier used.

It is then an advantage, in accordance with yet a further feature of the invention, if the switching speed of n-channel FETs and/or of p-channel FETs can be detected separately. The process for producing n-type FETs and p-type FETs includes completely different process steps. As such, it is possible that n-type FETs and p-type FETs located on the same substrate differ considerably with regard to their switching speeds.

Depending on the internal circuitry of an operational amplifier, its transient response may be mainly determined by the behavior of the n-type FETs or of the p-type FETs. In such a case, it is recommended to detect the switching speed of the significant device type separately.

It is an advantage, in accordance with yet an added feature of the invention, if the device for detecting the transistor switching speed includes an XOR gate. An undelayed edge signal and an edge signal delayed through an inverter chain are applied to the inputs of the XOR gate. Using the simple circuit, the signal delay effected by the inverter chain can be converted into a pulse, the duration of which corresponds exactly to the signal delay caused by the inverter chain. Because the inverter chain is built up of individual FETs, the circuit can be used for detecting the transistor switching speed. In particular, it is possible to construct the inverter chain such that the delay is caused either mainly by n-type FETs or mainly by p-type FETs. As such, the circuit can also be used for separately detecting the switching speed of n-channel FETs and/or of p-channel FETs.

In accordance with yet an additional feature of the invention, there is provided an inverter chain and the detector has one of an XOR gate with XOR inputs, one of the XOR inputs receiving an undelayed edge signal, and another of the XOR inputs receiving an edge signal delayed through the inverter chain, and an XNOR gate with XNOR inputs, one of the XNOR inputs receiving an undelayed edge signal and another of the XNOR inputs receiving an edge signal delayed through the inverter chain.

Quite generally, it is an advantage, in accordance with yet an additional feature of the invention, if the device for detecting the transistor switching speed generates pulses, the duration of which characterizes the switching speed of the transistors. The duration of such pulses can be detected accurately with the aid of counter and timer chips and can be used as the basis for digital closed-loop control.

It is of advantage, in accordance with again another feature of the invention, to adjust the duration of the switching-clock phases in which all switching-clock signals are in the off-phase in dependence on the duration of the measuring circuit pulses. As the switching of the transistors becomes faster, the pulses occurring at the output of the measuring circuit become shorter and the on-phases that can be selected also become shorter. The common off-phases of the switching-clock signals can be correspondingly extended.

In accordance with again a further feature of the invention, the duration of the switching-clock phases in which all switching-clock signals are in the off-phase can be adjusted in a number of predetermined steps. The embodiment is based on the concept that a large proportion of the power saving can be achieved already with a relatively coarse adjustment of the duration of the on-phases and of the common off-phase. As such, it makes sense to adapt the duration of the switching-clock phases in which all switching-clock signals are in the off-phase only in steps. The adaptation can be achieved with little circuit expenditure.

In accordance with again an added feature of the invention, the clock generator or means for clock generation and the device for varying the switching-clock phases in which all switching-clock signals are in the off-phase are preferably implemented by a programmable clock generator. In a programmable clock generator, the lengths of the individual switching-clock phases are represented digitally and are converted into corresponding switching-clock signals by counter and timer circuits. The duration of the individual switching-clock phases can be reprogrammed in a simple manner.

As an alternative, it is an advantage, in accordance with again an additional feature of the invention, if an external squarewave generator and a divider circuit implement the clock generator and the device for varying the switching-clock phases in which all switching-clock signals are in the off-phase. In such a configuration, the divider circuit generates the at least two switching-clock signals from the squarewave signal. The generation makes it possible to find out with little external circuit expenditure what the magnitude of the spread of the transient response is with a certain filter or converter circuit and whether or not there is still potential for power saving. The duty ratio of the squarewave signal can be adjusted at the external squarewave generator. The common off-phase of the switching-clock signals can be varied by the duty ratio.

It is an advantage, in accordance with still another feature of the invention, if the circuit configuration is implemented in fully differential circuit technology. In mobile radio technology applications in particular, differential construction of the signal lines makes it possible to eliminate interference effectively.

With the objects of the invention in view, there is also provided a method for clocking successive operational amplifier stages constructed in switched op-amp technology, including the steps of generating at least two non-overlapping switching-clock signals, switching a first operational amplifier on and off with a first signal of the two switching-clock signals, switching a second operational amplifier on and off with a second signal of the switching-clock signals, and varying switching-clock phases in which the operational amplifiers are switched off.

In the method according to the invention for clocking successive operational amplifier stages constructed in switched op-amp technology, at least two non-overlapping switching-clock signals are generated in a first step, the first switching-clock signal switching a first operational amplifier on and off, and the second switching-clock signal switching a second operational amplifier on and off. In a second step, the phases of the switching-clock signals in which all operational amplifiers are switched off are varied.

Introducing a controllable common off-phase makes it possible to reduce the on times of the operational amplifier to the necessary degree so that the power consumption of the circuit can be restricted to a minimum.

In accordance with still a further mode of the invention, each of the switching-clock phases in which the operational amplifiers are switched off is varied.

In accordance with still an added mode of the invention, each second one of the switching-clock phases in which the operational amplifiers are switched off is varied.

In accordance with still an additional mode of the invention, a duration of the switching-clock phases in which the operational amplifiers are switched off dependent on a transient response of the operational amplifiers is varied.

In accordance with another mode of the invention, a duration of the switching-clock phases in which the operational amplifiers are switched off dependent on a switching speed of transistors of the operational amplifiers is varied.

In accordance with a further mode of the invention, at least one of a switching speed of n-channel FETs and a switching speed of p-channel FETs are separately detected.

In accordance with an added mode of the invention, at least one of a switching speed of n-channel FETs and a switching speed of p-channel FETs are separately detected.

In accordance with an additional mode of the invention, a duration of the switching-clock phases in which the operational amplifiers are switched off is adjusted in a number of predetermined steps.

In accordance with yet another mode of the invention, the non-overlapping switching-clock signals are generated with a programmable clock generator.

In accordance with yet a further mode of the invention, the non-overlapping switching-clock signals are generated with an external squarewave generator and a divider circuit.

In accordance with a concomitant mode of the invention, the switching-clock phases in which the operational amplifiers are switched off are varied by adjusting a duty ratio of a squarewave signal from the squarewave generator.

Other features that are considered as characteristic for the invention are set forth in the appended claims.

Although the invention is illustrated and described herein as embodied in a variable clock configuration for switched op-amp circuits, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Figure 1:
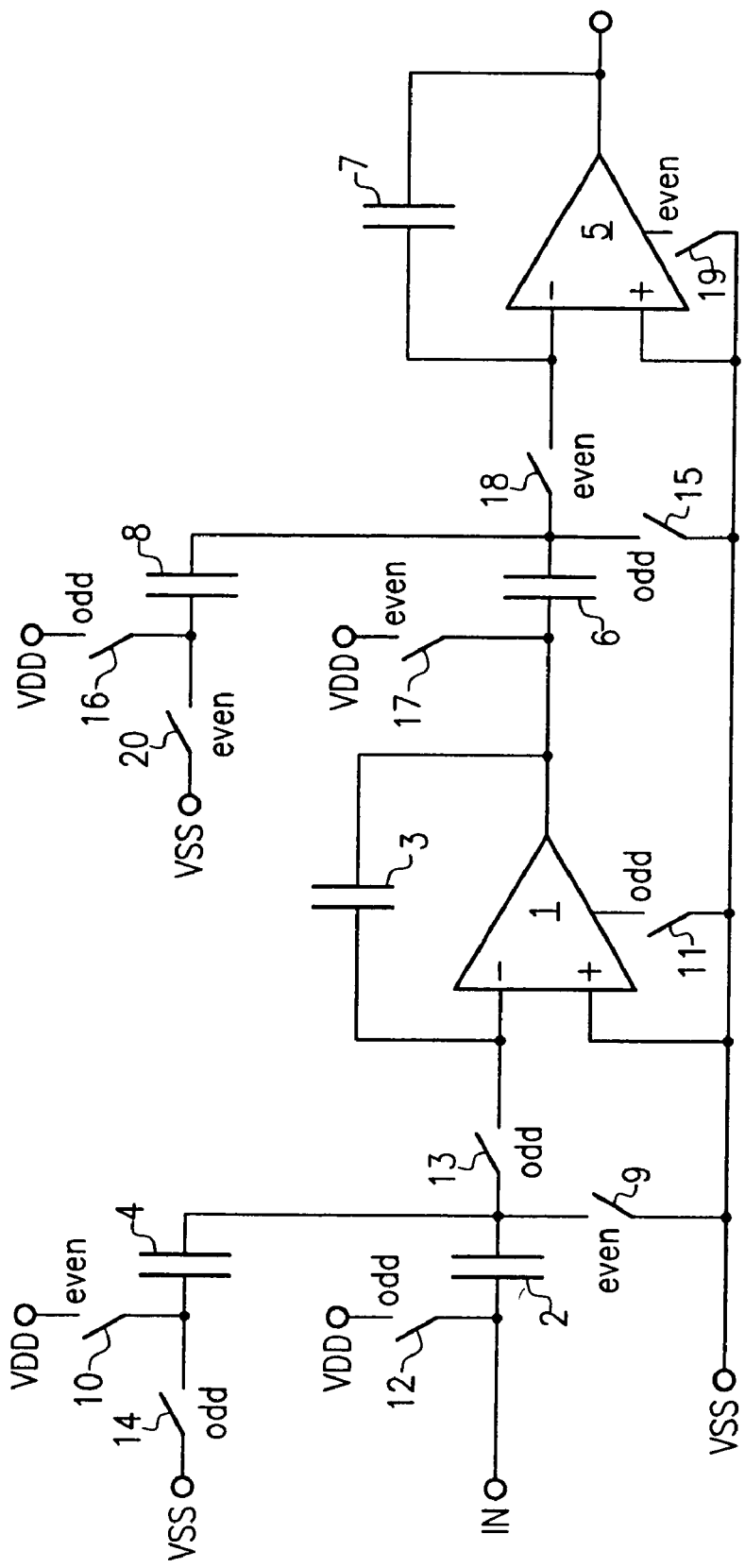
FIG. 1 is a schematic circuit diagram of a prior art circuit in switched op-amp technology including a number of operational amplifier stages.

In all the figures of the drawing, sub-features and integral parts that correspond to one another bear the same reference symbol in each case.

Referring now to the figures of the drawings in detail and first, particularly to FIG. 1 thereof, there is shown a prior art switched op-amp circuit that includes two operational amplifier stages. The operational amplifier 1, the sampling capacitor 2, the integration capacitor 3, and the capacitor 4 form the first operational amplifier stage. The second operational amplifier stage includes the operational amplifier 5, the sampling capacitor 6, the integration capacitor 7, and the capacitor 8. The various switches shown in FIG. 1 are switched on and off by two non-overlapping switching-clock signals that will be called even and odd switching-clock signals in the text that follows. Before discussing the operation of the circuit shown in FIG. 1 in greater detail, the generation of these two switching-clock signals will be explained with reference to FIGS. 2A and 2B.

Figure 2A:
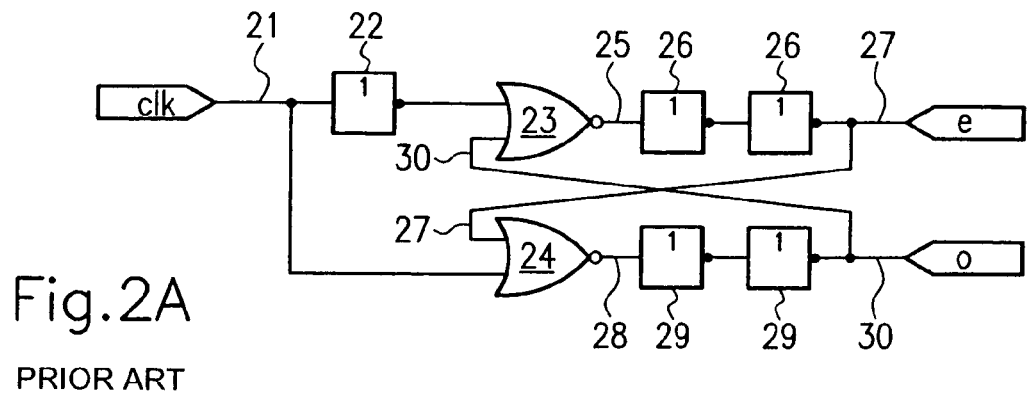
FIG. 2A is a block and schematic circuit diagram of a prior art circuit for generating a non-overlapping two-phase clock.

FIG. 2A illustrates a prior art clock generator for generating a non-overlapping two-phase clock. A rectangular input clock signal 21 having the frequency $f_{clk}$ is applied to the input of the circuit. The variation with time of the input clock signal 21 is shown in FIG. 2B.

The input clock signal 21 is present, on one hand, at the input of the inverter 22 and also at an input of the second NOR gate 24. The output of the inverter 22 is connected to an input of the first NOR gate 23. At the output of the NOR gate 23, the output signal 25 is present that is delayed by the two inverters 26. At the output of the inverter chain, the even switching-clock signal 27 can be picked up, the variation with time of which is shown in FIG. 2B. The even switching-clock signal 27 is connected to the second input of the second NOR gate 24, at the output of which the output signal 28 appears. The output signal 28 is delayed by the two inverters 29 and, at the output of the inverter chain, the odd switching-clock signal 30 can be picked up, the variation of time of which is also shown in FIG. 2B. The odd switching-clock signal 30 is supplied to the second input of the first NOR gate 23.

Figure 2B:
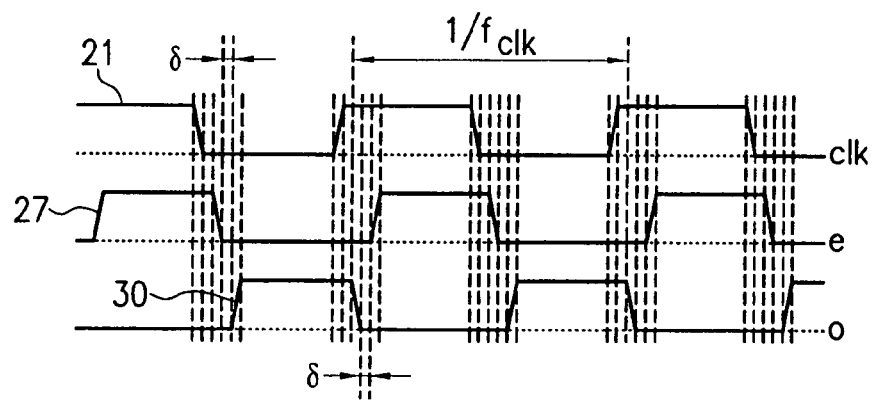
FIG. 2B is a timing diagram illustrating the input clock signal and the even and odd switching-clock signals generated by the circuit according to FIG. 2A.

The comparison of the variation of the even switching-clock signal 27 and of the odd switching-clock signal 30 by referring to FIG. 2B shows that the odd switching-clock signal 30 is in each case switched off during the on-phase of the even switching-clock signal 27. In addition, both switching-clock signals are in a common off-phase between the on-phase of the even switching-clock signal 27 and the on-phase of the odd switching-clock signal 30 during the period δ. It is, therefore, called a "non-overlapping two-phase clock".

Each of the switches shown in FIG. 1 is now switched on and off by the even switching-clock signal or by the odd switching-clock signal. Next to each switch, the switching clock by which it is clocked is noted.

Firstly, the first operational amplifier stage will now be considered during the on-phase of the even switching clock. The switches 9 and 10 are closed, therefore, whereas the switches 11, 12, 13 and 14 are open. The operational amplifier 1 is, therefore, inactive in such a phase. The input signal IN is present at one terminal of the sampling capacitor 2 and the other terminal is connected to VSS. The sampling capacitor 2 is, therefore, charged up by the input signal. The capacitor 4 is connected to VSS and VDD through the switches 9 and 10 and is, therefore, charged up by the supply voltage. The on-phase of the even switching-clock signal is followed—after a short common off-phase of both switching-clock signals—by the on-phase of the odd switching-clock signal. During such a phase, the switches 9 and 10 are open whereas the switches 11, 12, 13 and 14 are closed. Therefore, the operational amplifier 1 is switched on in the phase. One terminal of the sampling capacitor 2 is connected to VDD through the switch 12. The other terminal of the capacitor 2 is connected to the inverting input of the operational amplifier 1 through the switch 13. The capacitor 4 that is connected to VSS through the switch 14 in the phase additionally couples in a constant charge that produces a type of DC shift. The injected charge makes it possible to achieve an approximate potential VSS at the inverting input. The operational amplifier 1, as the active component, now attempts to correct its output to such an extent that the difference between the input voltages becomes zero. Therefore, the operational amplifier 1 attempts to bring the inverting input to VSS potential. As a result, precisely the charge quantity that has been sampled at the sampling capacitor 2 is transferred to the integration capacitor 3.

The second operational amplifier stage is operated in the opposite phase to the first one. Still being considered is the on-phase of the odd switching clock in which the operational amplifier 1 is active. The switches 15 and 16 of the second op-amp stage are closed and that is why the output of the operational amplifier 1 charges up the sampling capacitor 6 belonging to the second operational amplifier stage. Thus, the integration-phase of the first operational amplifier stage and the sampling phase of the second operational amplifier stage are taking place at the same time.

In the subsequent switching-clock phase, the charge quantity sampled at the sampling capacitor 6 is transferred to the integration capacitor 7. During such integration-phase of the second operational amplifier stage, the first operational amplifier stage is already back in the sampling phase.

Figure 3:
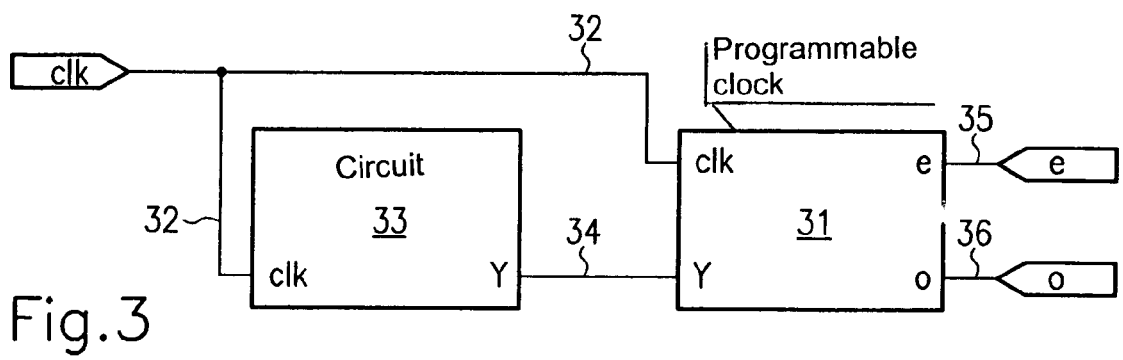
FIG. 3 is a block circuit diagram of a clock generating unit according to the invention including a circuit for determining the transistor switching speed.

The switching clock configuration shown in FIG. 2B is modified by the invention such that the on times of the operational amplifiers are shortened and, thus, a power saving is achieved. The hardware according to the invention is illustrated in FIG. 3. A programmable clock generator 31 is supplied with a squarewave input clock signal 32 having the frequency $f_{clk}$. A circuit 33 for determining the transistor switching speed determines the switching speed of the transistors that is significant for the transient response of the operational amplifiers. A pulse signal 34 characteristic of the switching speed is supplied to the programmable clock generator 31 and taken into consideration in the generation of the even switching-clock signal 35 and of the odd switching-clock signal 36. The faster the switching of the devices are, the shorter the on-phases of the operational amplifiers can be.

Figure 4:
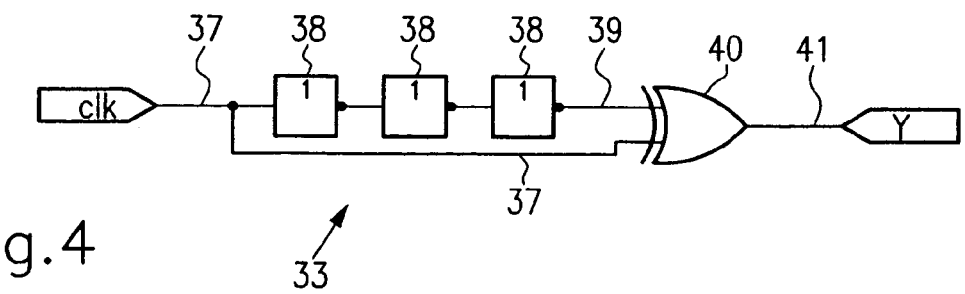
FIG. 4 is a block and schematic circuit diagram of an example circuit for determining the gate delay and the transistor switching speed for use in the clock generating unit according to FIG. 3.

FIG. 4 illustrates an example for a circuit 33 for determining the transistor switching speed. The input clock signal 37 is present at the first input of the XOR gate 40. At the second input of the XOR gate 40, the delayed and inverted clock signal 39 is present that is obtained from the input clock signal 37 by an odd number of inversions (FIG. 4 shows three inverters 38). If the input clock signal 37 is at 0, the signal 39 assumes the value 1 and the output signal 41 of the XOR gate 40 assumes the value 1. If the input clock signal 37 changes from 0 to 1, the new value 1 is immediately available at the first input of the XOR gate 40. The signal 39 only changes to the new value 0 after a certain time delay that is determined by the gate delay of the three inverters 38. During a period that is characteristic of the gate delay, the output signal 41 is, therefore, at 0 and then it assumes the value 1.

The duration of the pulses in the output signal 41 represents a measure of the switching speed of the transistors of the substrate. The measurement makes it possible to detect the effect of process spreads on the transistor switching speed directly on the chip and to take it into consideration during the clock generation. Instead of the XOR gate, an XNOR gate can also be used for determining the switching speed of the transistors.

Figure 5A:
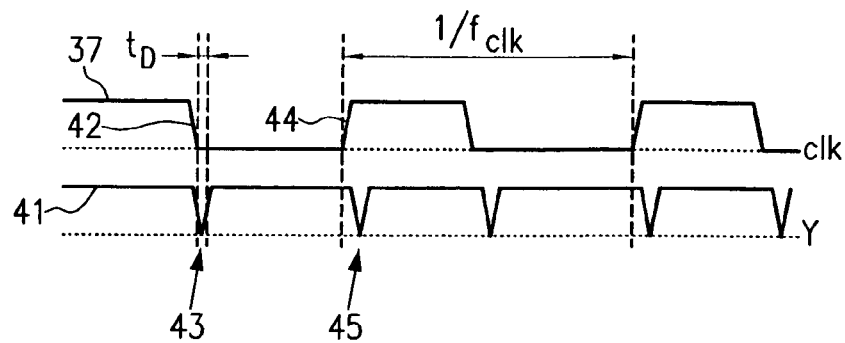
FIG. 5A is a timing diagram illustrating the input clock signal and the output signal of the circuit of FIG. 4 for a case of short gate delays.

FIG. 5A illustrates the variation with time of the input clock signal 37 and of the output signal 41 of the XOR gate 40. When the input clock signal 37 changes from 1 to 0, a falling signal edge 42 is obtained that triggers a pulse 43 with a pulse width $t_D$ in the output signal 41. During the pulse period $t_D$, the output signal 41 assumes the value 0.

When the input clock signal 37 changes from 0 to 1, a rising signal edge 44 is obtained that also triggers a pulse 45 of length $t_D$. The pulses 43, 45 shown in FIG. 5A are short and the corresponding values of $t_D$ are low. Accordingly, the inverters 38 only produce a slight signal delay, which allows a high switching speed of the transistors and a short transient response of the operational amplifiers to be inferred.

Figure 5B:
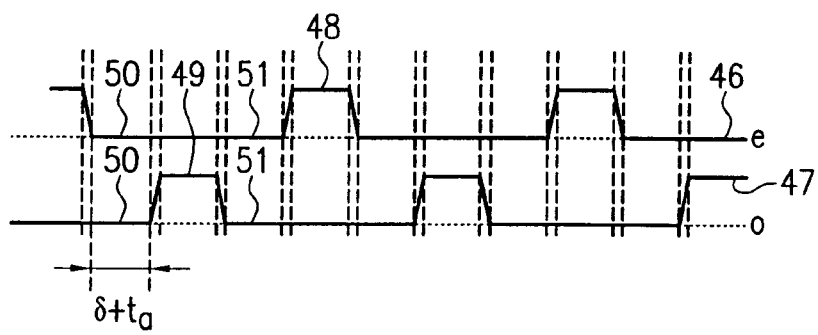
FIG. 5B is a timing diagram illustrating a variation with time of the even and odd switching-clock signals generated by the clock generating unit according to FIG. 3 for the case of short gate delays.

The pulse signal 41 is supplied to the programmable clock generator that digitizes the period of the pulses 43, 45 and uses them for calculating the switching clock configuration. For the case of a short pulse duration $t_D$ shown in FIG. 5A, the switching clock signals generated by the programmable clock generator, the even switching-clock signal 46, and the odd switching-clock signal 47 are shown in FIG. 5B. Because of the fast transient response of the operational amplifiers, only short on-phases 48, 49 are required.

The switching clock phases 50, 51, in which both switching-clock signals 46 and 47 are in the off-phase, can be correspondingly extended. In the prior art clock configuration shown in FIG. 2B, the common off-phases had the period δ. In the clock configuration shown in FIG. 5B, however, the duration of the common off-phases has been increased to δ+$t_a$. The operational amplifiers are only switched on until the transient is finished. During the common off-phases, all operational amplifiers are inactive.

Figure 6A:
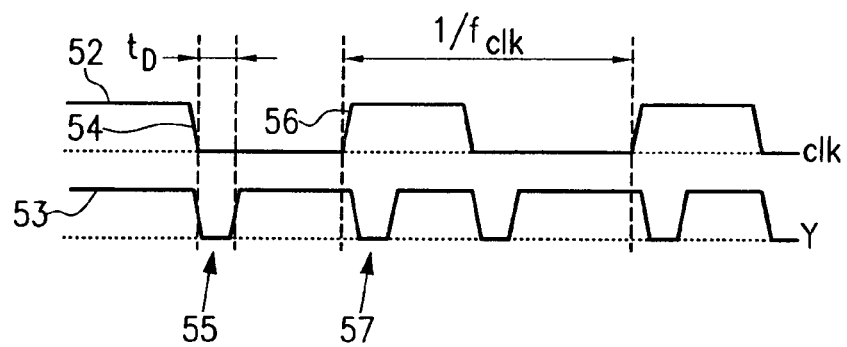
FIG. 6A is a timing diagram illustrating a representation of the input clock signal and of the output signal of the circuit shown in FIG. 4 for a case of long gate delays.

FIG. 6A shows the input clock signal 52 and the output signal 53 of the XOR gate 40 for the case of transistors switching slowly or for long gate delays. The falling signal edge 54 causes a pulse 55 of duration $t_D$ in the output signal 53 and the rising signal edge 56 correspondingly causes a pulse 57 of duration $t_D$. In the example shown in FIG. 6A, the transistors only have a low switching speed. The inverters 38, therefore, delay the signal considerably and the delay leads to a long pulse duration $t_D$, making it possible to infer a slow transient response of the operational amplifiers.

Figure 6B:
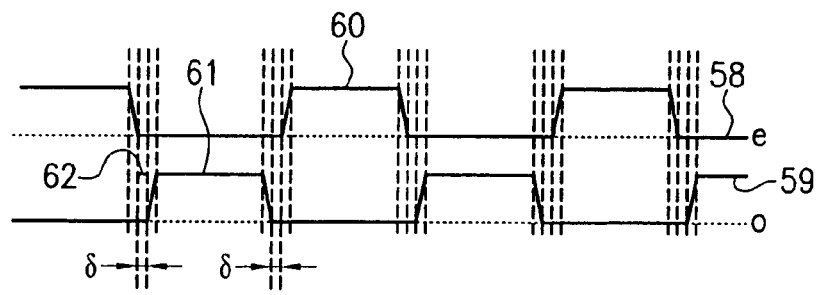
FIG. 6B is a timing diagram illustrating a variation with time of the even and odd switching-clock signals generated by the clock generating unit according to FIG. 3 for the case of long gate delays.

FIG. 6B shows the variation with time of the associated switching-clock signals, the even switching-clock signal 58 and the odd switching-clock signal 59. Because of the slow transient response of the operational amplifiers, the on-phases 60, 61 of the two switching-clock signals must be selected to be long. Accordingly, the common off-phase 62 of the switching-clock signals must be reduced to the minimum period δ. Accordingly, $t_a$ is set to be =0.

The programmable clock generator maps the pulse duration $t_D$ onto the duration of the common off-phase δ+$t_a$, a small value of $t_D$ being mapped onto a large value of δ+$t_a$ and a large value of $t_D$ being mapped onto a small value of $t_a$. As such, the switching clock configuration can be adapted to the switching speed of the transistors such that the power saving is at a maximum.

Figure 7:
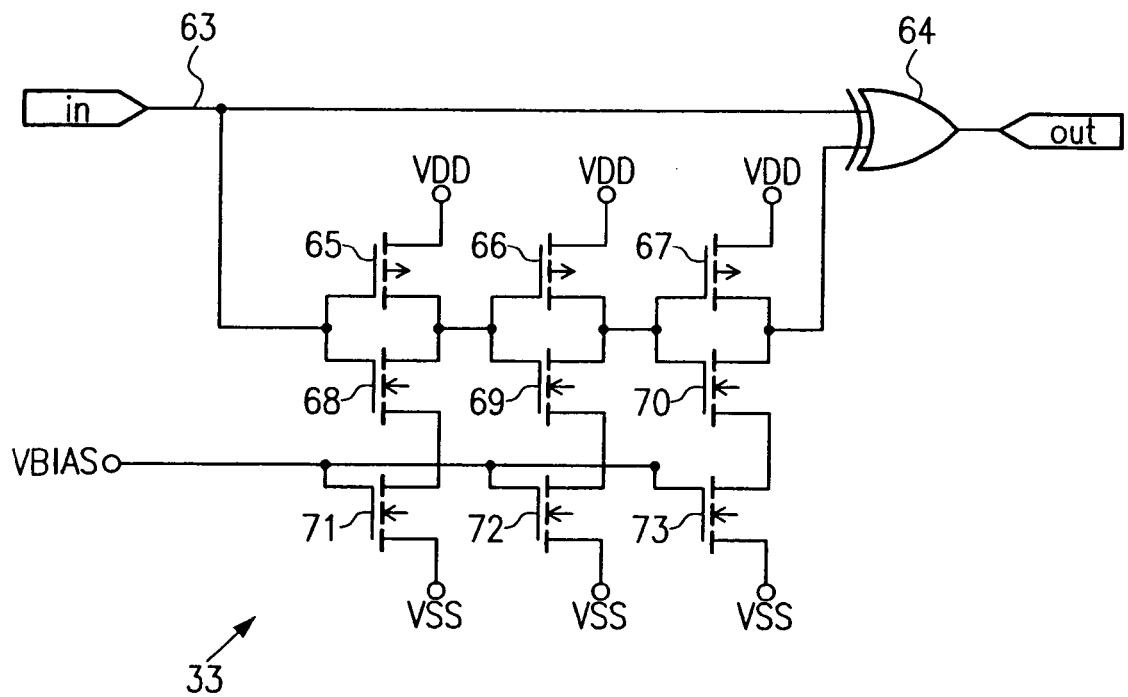
FIG. 7 is a schematic circuit diagram of a circuit providing for the separate determination of the switching speed of n-channel MOSFETs according to the invention.

FIG. 7 illustrates an embodiment of the circuit 33 for determining the transistor switching speed that selectively detects the switching characteristic of n-type MOSFETs. The use of such a circuit is recommended if the transient response of the operational amplifiers used is mainly determined by the characteristics of the transistors of the n-type. The circuit includes the p-type MOSFETs 65, 66, 67 and the n-type MOSFETs 68, 69, 70, 71, 72, 73. The current through the FETs depends on the width/length ratio (W/L) of the respective FET. In the example illustrated in FIG. 7, the p-type FETs 65, 66, 67 and the n-type FETs 68, 69, 70 have a large W/L. The n-type FETs 71, 72, 73, the W/L ratio of which is much lower than that of the other devices, therefore, have a current-limiting effect.

When the input signal 63 changes to VSS, the p-type FET 65 is gated on. The gate of the n-type MOSFET 69 is then at VDD and, if VBIAS has been suitably selected, the n-type FET 72 is also conducting. The potential VSS can then be switched through to the gate of the p-type FET 67. The p-type FET 67 places an input of the XOR gate 64 at VDD. Because of the low value of W/L in the case of the n-type FET 72, in comparison with the W/L values of the FETs 65, 67, 69, the total delay is essentially determined by the n-type FET 72. When the input signal 63 changes to VDD, in contrast, the total delay essentially depends on the switching speed of the n-type FETs 71 and 73. In every case, the total delay is, therefore, mainly determined by the n-type FETs having a small W/L.

Figure 8:
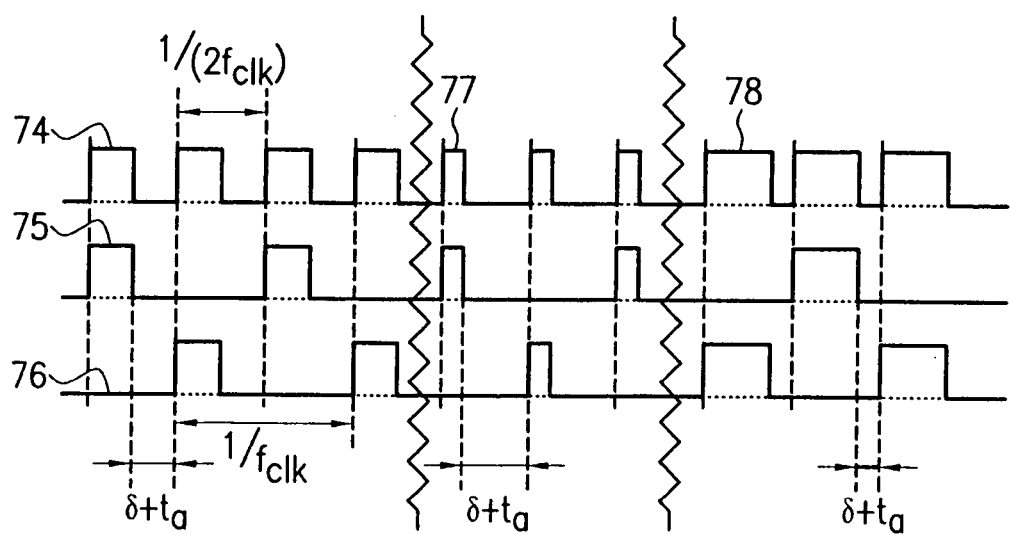
FIG. 8 is a timing diagram illustrating an overview of the clock signals of an external clock generating unit according to the invention in which the even clock signal and the odd clock signal are generated from a squarewave signal by a divider circuit.

FIG. 8 illustrates a method of how the clock configuration according to the invention can be generated externally by a squarewave generator and a divider circuit. The squarewave generator supplies a squarewave signal 74 having the frequency (2 $f_{clk}$). From the squarewave signal 74, the even switching-clock signal 75 and the odd switching-clock signal 76, which each have a period of $$\frac{1}{f_{clk}},$$

are derived by a divider circuit.

The duration of the common off-phase in which both switching-clock signals are equal to 0 can be adjusted by varying the duty ratio of the squarewave signal. The duty ratio of the squarewave signal 74 is 1/2 whereas the duty ratio of the squarewave signal 77 is 1/4. The squarewave signal 78 has a duty ratio of 3/4. The values of δ+$t_a$ that belong to the individual duty ratios can be seen in the clock configuration illustrated in FIG. 8. The greater the selected duty ratio, the shorter the duration of the common off-phase δ+$t_a$. Conversely, a small duty ratio produces a distinct extension of the common off-phase. The external circuit shown in FIG. 8 makes it possible to find out the magnitude of the spread of the transient response with a certain switched op-amp circuit and whether or not there is still potential for saving power.

We claim:

1. A circuit configuration in switched op-amp technology, comprising:
   at least one switchable operational amplifier having an input and an output and transistors having a switching speed;
   at least one sampling capacitor connected to said input;
   at least one integrating capacitor connected to said input and to said output;
   a detector for detecting the switching speed of said transistors, said detector being connected to said operational amplifier;
   a clock generator producing a first and a second switching signal each having switching-clock phases including an on-phase and an off-phase, the on-phases of said first and said second switching clock signal being non-overlapping;
   said clock generator controlling charging of said sampling capacitor with said first switching-clock signal and switching said operational amplifier on and off with said second switching-clock signal; and
   a phase-variance device varying said switching-clock phases in which said first and second switching-clock signals are in said off-phase, said phase-variance device connected to said clock generator, said phase-variance device being configured for varying a duration of said switching-clock phases in which said first and second switching-clock signals are in said off-phase dependent upon said switching speed of said transistors as detected by said detector and enlarging said duration when said switching speed is high and reducing said duration when said switching speed is low.

2. The circuit configuration according to claim 1, wherein said phase-variance device is configured to vary each of said switching-clock phases in which said first and second switching-clock signals are in said off-phase.

3. The circuit configuration according to claim 1, wherein said phase-variance device is configured to vary each second one of said switching-clock phases in which said first and second switching-clock signals are in said off-phase.

4. The circuit configuration according to claim 1, wherein:
said operational amplifier has a transient response; and
said phase-variance device is configured to vary a duration of said switching-clock phases in which said first and second switching-clock signals are in said off-phase dependent upon said transient response of said operational amplifier.

5. The circuit configuration according to claim 1, wherein:
said operational amplifier has transistors having a switching speed; and
said phase-variance device is configured to vary a duration of said switching-clock phases in which said first and second switching-clock signals are in said off-phase dependent upon said switching speed of said transistors.

6. The circuit configuration according to claim 1, wherein:
said transistors include at least one of:
n-channel FETs; and
p-channel FETs;
said transistors each have a respective switching speed; and
said detector separately detects said switching speed of said n-channel FETs and said p-channel FETs.

7. The circuit configuration according to claim 1, including an inverter chain, said detector having one of:
an XOR gate with XOR inputs, one of said XOR inputs receiving an undelayed edge signal, and another of said XOR inputs receiving the edge signal delayed through said inverter chain; and an XNOR gate with XNOR inputs, one of said XNOR inputs receiving the edge signal and another of said XNOR inputs receiving the edge signal delayed through said inverter chain.

8. The circuit configuration according to claim 1, wherein said detector generates detector pulses having a duration characterizing said switching speed of said transistors.

9. The circuit configuration according to claim 8, wherein said phase-variance device is configured to adjust a duration of said switching-clock phases in which said first and second switching-clock signals are in said off-phase dependent upon a duration of said detector pulses.

10. The circuit configuration according to claim 1, wherein said phase-variance device is configured to adjust a duration of said switching-clock phases in which said first and second switching-clock signals are in said off-phase in a given number of predetermined steps.

11. The circuit configuration according to claim 1, wherein said clock generator and said phase-variance device are embodied as a programmable clock generator.

12. The circuit configuration according to claim 1, wherein said clock generator and said phase-variance device are embodied as:
an external squarewave generator producing a squarewave signal; and
a divider circuit connected to said squarewave generator, said divider circuit generating said at least two switching-clock signals from said squarewave signal.

13. The circuit configuration according to claim 12, wherein:
said squarewave signal has a duty ratio; and
adjustment of said duty ratio varies said switching-clock phases in which said first and second switching-clock signals are in said off-phase.

14. A circuit configuration in fully differential circuit technology, comprising:
at least one switchable operational amplifier having an input and an output and transistors having a switching speed;
at least one sampling capacitor connected to said input;
at least one integrating capacitor connected to said input and to said output;
a detector for detecting the switching speed of said transistors, said detector being connected to said operational amplifier;
a clock generator producing a first and a second switching signal each having switching-clock phases including an on-phase and an off-phase, the on-phases of said first and said second switching clock signal being non-overlapping;
said clock generator controlling charging of said sampling capacitor with said first switching-clock signal and switching said operational amplifier on and off with said second switching-clock signal; and
a phase-variance device varying said switching-clock phases in which said first and second switching-clock signals are in said off-phase, said phase-variance device connected to said clock generator, said phase-variance device being configured for varying a duration of said switching-clock phases in which said first and second switching-clock signals are in said off-phase dependent upon said switching speed of said transistors as detected by said detector and enlarging said duration when said switching speed is high and reducing said duration when said switching speed is low.

15. A circuit configuration in switched op-amp technology, comprising:
at least one switchable operational amplifier having an input and an output and transistors having a switching speed;
at least one sampling capacitor connected to said input;
at least one integrating capacitor connected to said input and to said output;
a detector for detecting the switching speed of said transistors, said detector being connected to said operational amplifier;
clock generator means for generating a first and a second switching signal each having an on-phase and an off-phase, the on-phases of said first and said second switching clock signal being non-overlapping;
said clock generator means controlling charging of said sampling capacitor with said first switching-clock signal and switching said operational amplifier on and off with said second switching-clock signal; and
phase-variance means for varying switching-clock phases in which said first and second switching-clock signals are in said off-phase, said phase-variance means connected to said clock generator means, said phase-variance means being configured for varying a duration of said switching-clock phases in which said first and second switching-clock signals are in said off-phase dependent upon said switching speed of said transistors as detected by said detector and enlarging said duration when said switching speed is high and reducing said duration when said switching speed is low.

16. A method for clocking successive operational amplifier stages constructed in switched op-amp technology, which comprises:
generating at least two non-overlapping switching-clock signals;

switching a first operational amplifier on and off with a first signal of the two switching-clock signals; switching a second operational amplifier on and off with a second signal of the switching-clock signals;

varying switching-clock phases of the first and second signals in which the operational amplifiers are switched off; and providing a variable delay between the switching-clock phases of the first and second signals during which the operational amplifiers are switched off.

17. The method according to claim 16, which further comprises varying each of the switching-clock phases in which the operational amplifiers are switched off.

18. The method according to claim 16, which further comprises varying each second one of the switching-clock phases in which the operational amplifiers are switched off.

19. The method according to claim 16, which further comprises varying a duration of the switching-clock phases in which the operational amplifiers are switched off dependent on a transient response of the operational amplifiers.

20. The method according to claim 16, which further comprises varying a duration of the switching-clock phases in which the operational amplifiers are switched off dependent on a switching speed of transistors of the operational amplifiers.

21. The method according to claim 16, which further comprises separately detecting at least one of a switching speed of n-channel FETs and a switching speed of p-channel FETs.

22. The method according to claim 20, which further comprises separately detecting at least one of a switching speed of n-channel FETs and a switching speed of p-channel FETs.

23. The method according to claim 16, which further comprises adjusting a duration of the switching-clock phases in which the operational amplifiers are switched off in a number of predetermined steps.

24. The method according to claim 16, which further comprises generating the at least two non-overlapping switching-clock signals with a programmable clock generator.

25. The method according to claim 16, which further comprises generating the at least two non-overlapping switching-clock signals with an external squarewave generator and a divider circuit.

26. The method according to claim 25, which further comprises varying the switching-clock phases in which the operational amplifiers are switched off by adjusting a duty ratio of a squarewave signal from the squarewave generator.

27. The method according to claim 16, which further comprises varying a duration of said switching-clock phases in which said first and second switching-clock signals are in said off-phase dependent upon said switching speed of said transistors as detected by said detector and enlarging said duration when said switching speed is high and reducing said duration when said switching speed is low.

28. The method according to claim 16, which further comprises:

providing said transistors with at least one of:

n-channel FETs; and p-channel FETs;

said transistors each having a respective switching speed; and separately detecting said switching speed of said n-channel FETs and said p-channel FETs.

29. The circuit configuration according to claim 14, wherein:

said transistors include at least one of:

n-channel FETs; and p-channel FETs;

said transistors each have a respective switching speed; and said detector separately detects said switching speed of said n-channel FETs and said p-channel FETs.

30. The circuit configuration according to claim 15, wherein:

said transistors include at least one of:

n-channel FETs; and p-channel FETs;

said transistors each have a respective switching speed; and said detector separately detects said switching speed of said n-channel FETs and said p-channel FETs.

* * * * *